(12) United States Patent
Doerrer et al.

(10) Patent No.: US 7,432,840 B2
(45) Date of Patent: Oct. 7, 2008

(54) MULTI-BIT SIGMA/DELTA CONVERTER

(75) Inventors: Lukas Doerrer, Villach (AT); Patrizia Greco, St.-Ulrich (AT); Mario Motz, Wernberg (AT); Patrick Torta, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/655,772

(22) Filed: Jan. 19, 2007

(65) Prior Publication Data

US 2007/0188362 A1   Aug. 16, 2007

(30) Foreign Application Priority Data

Jan. 20, 2006   (DE)   ........................ 10 2006 002 901

(51) Int. Cl.
  *H03M 3/00*   (2006.01)
(52) U.S. Cl. ........................ 341/143; 341/155
(58) Field of Classification Search ................. 341/143, 341/144, 155
  See application file for complete search history.

(56) References Cited

U.S. PATENT DOCUMENTS

| | | | | |
|---|---|---|---|---|
| 5,982,313 | A * | 11/1999 | Brooks et al. ................ | 341/143 |
| 6,346,898 | B1 | 2/2002 | Melanson | |
| 6,400,297 | B1 * | 6/2002 | Tucker ........................ | 341/143 |
| 6,639,530 | B2 * | 10/2003 | Jensen et al. ................. | 341/143 |
| 6,674,381 | B1 * | 1/2004 | Gomez et al. ................ | 341/143 |
| 6,795,003 | B2 * | 9/2004 | Wang et al. .................. | 341/143 |
| 6,919,832 | B2 * | 7/2005 | Brooks ........................ | 341/143 |
| 7,053,808 | B2 * | 5/2006 | Chen ........................... | 341/144 |
| 7,119,725 | B1 * | 10/2006 | Shih ............................ | 341/143 |
| 7,183,955 | B1 * | 2/2007 | Shih ............................ | 341/143 |
| 7,215,269 | B2 * | 5/2007 | Lee et al. ..................... | 341/143 |
| 7,227,481 | B2 * | 6/2007 | del Mar Chamarro Marti et al. ........................... | 341/143 |
| 2005/0093726 | A1 | 5/2005 | Hezar et al. | |

OTHER PUBLICATIONS

Patón, Susana, et al. "A 70-mW 300-MHz CMOS Continuous-Time ΣΔ ADC With 15-MHz Bandwidth and 11 Bits of Resolution." *IEEE Journal of Solid-State Circuits.* vol. 39. Jul. 2004. (8 pages).
Geerts, Yves, et al. *Design of Multi-Bit Delta-Sigma A/D Converters.* Boston: Kluwer Academic Publishers, 2002. (2 pages).

* cited by examiner

*Primary Examiner*—Khai M Nguyen
(74) *Attorney, Agent, or Firm*—Maginot, Moore & Beck

(57) ABSTRACT

A multi-bit sigma/delta converter for converting an analog input signal into a digital output signal comprises a filter device for filtering the analog input signal which is added to a feedback signal to form an intermediate signal. An integrator device for integrating the filtered intermediate signal added to an inner feedback signal forms a quantizer input signal. A quantizer device quantizes the quantizer input signal to form the digital output signal. An inner feedback digital/analog converter is provided for converting the digital output signal directly into the inner feedback signal. A DEM device for performing dynamic element matching on the digital output signal and providing a matched digital signal is provided and a feedback digital/analog converter for converting the matched digital signal into the feedback signal is implemented.

20 Claims, 5 Drawing Sheets

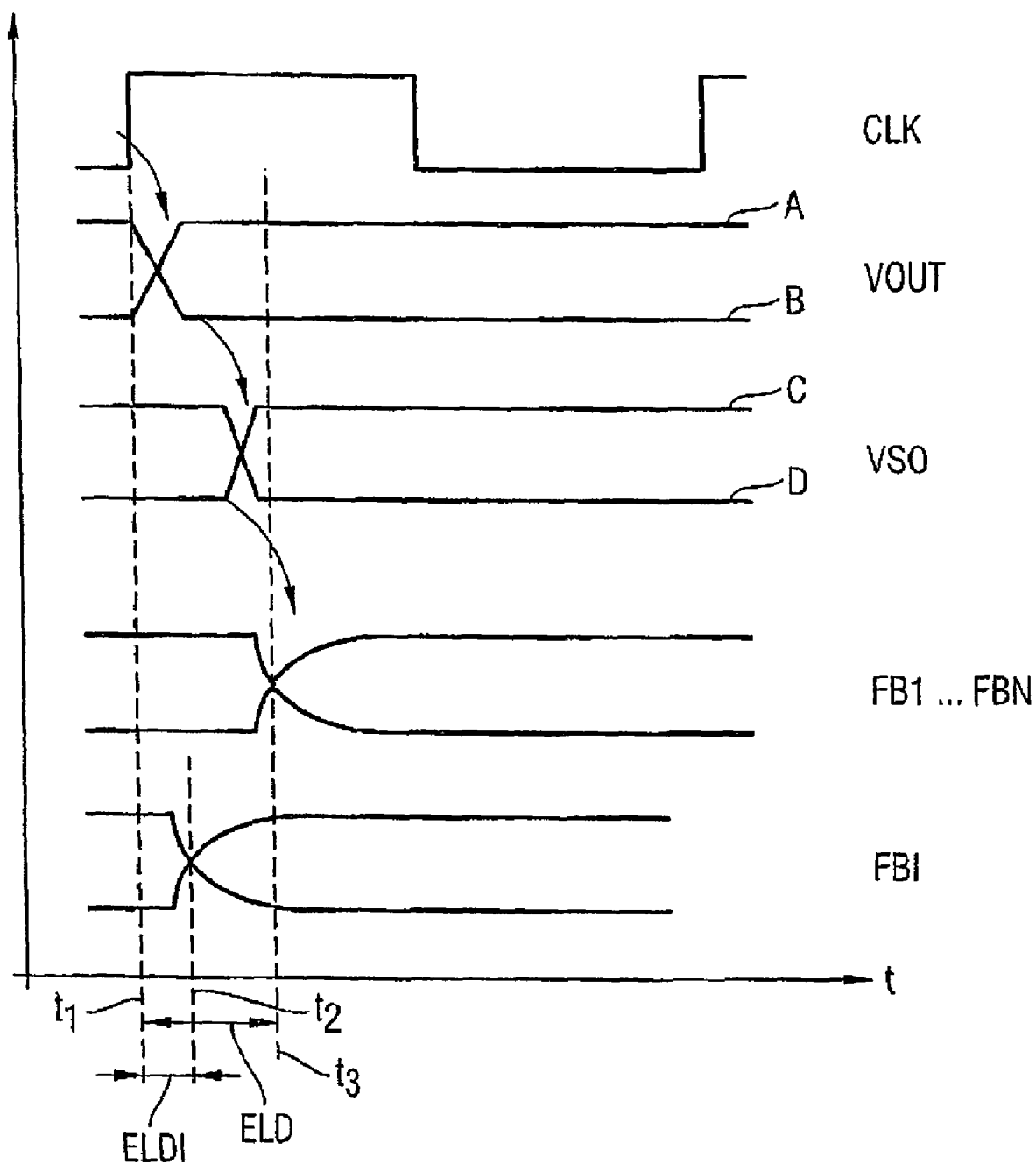

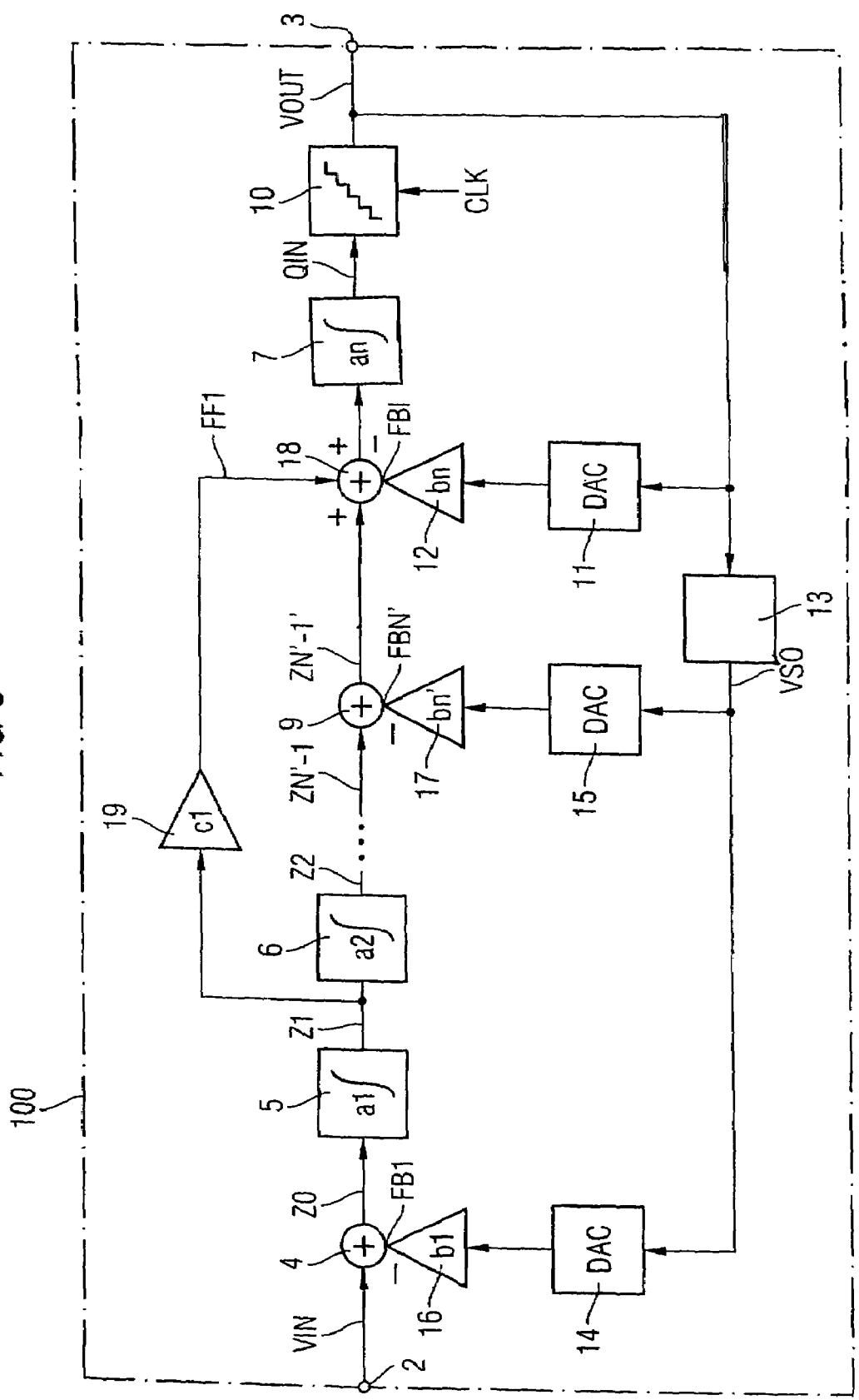

US 7,432,840 B2

MULTI-BIT SIGMA/DELTA CONVERTER

BACKGROUND OF THE INVENTION

The present invention relates to a multi-bit sigma/delta converter having particularly good linearity characteristics, wherein dynamic element matching is performed internally.

A reliable high-quality analog/digital conversion is needed, e.g., for digital receiver circuits in the mobile radio field in order to convert analog received signals with low noise into digital signals without frequency influences from adjacent transmission channels occurring. Furthermore, the conversion should be as linear as possible and achieve good resolution.

In the past, sigma/delta analog converters were used for this purpose. Such sigma/delta analog to digital converters are operated with particularly high oversampling and, at the same time, perform certain filtering of the analog input signal and of the quantization noise. During the sigma/delta conversion or a sigma/delta modulation, a feedback signal is subtracted from an analog input signal and subjected to filtering, in most cases integration. The integrated signal is digitally converted by a quantizer which is constructed, for example, as a flash analog/digital converter and output as output signal of the corresponding sigma/delta modulator. The analog feedback signal is obtained from the digital output signal by a feedback signal digital/analog converter.

Depending on the design of the filter device, the sigma/delta converter is a discrete-time or continuous-time converter. In the discrete-time design, the filter H(z) is usually built up from switched capacitors (switch capacitor filter), whereas in the continuous-time sigma/delta converters, the corresponding loop filter is built up of a continuous-time filter H(s), for example by an operational amplifier resistance-capacitance filter circuit.

The linearity characteristics of the sigma/delta converter are essentially determined by the linearity of the feedback digital/analog converter. In order to improve the linearity, the method of dynamic element matching is frequently used. In this method, the positions of the bits of a digital output signal present in thermometer code are randomly exchanged, for example from clock cycle to clock cycle. In consequence, the converter elements of the digital/analog converter driven with such a thermometer code are thus uniformly used and driven with equal frequency on average. A mismatch of the converter elements is thus balanced out statistically so that a high linearity of the conversion result is achieved.

FIG. 1 shows a conventional sigma/delta modulator with dynamic element matching.

The multi-bit sigma/delta converter MSD is constructed with N feedback loops, wherein the analog input signal VIN is first conducted through a serial chain of integrators I1, I2, IN and is then supplied to a quantizer Q as quantizer input signal QIN. The quantizer Q supplies the digital output signal VOUT. The integrators I1, I2, IN are in each case preceded by an adder A1, A2, AN via which a respective feedback signal FB1, FB2, FN is subtracted from the respective output signal Z1, Z2, ZN of the preceding integrator I1, I2, IN.

The feedback signals FB1, FB2, FBN are obtained by feedback digital/analog converters FBD1, FBD2, FBDN from the digital output signal VOUT which is processed via a device for digital element matching DEM. During this process, the signal VSO is analog converted by the feedback digital/analog converters FBD1, FBD2, FBDN and loaded with respective weighting factors b1, b2, bn by amplifiers V1, V2, VN. The integrators I1, I2, IN also have gain factors a1, a2, an. A desired filtering can be set by selection of the weighting factors b1, b2, bn and/or gain factors a1, a2, an.

The device for dynamic element matching DEM exchanges the positions of the bits, present, for example, in thermometer code, of the digital output signal VOUT. The disadvantageous factor when using dynamic element matching is the signal delay time in the corresponding control loop generated by this means. In the ideal case, the converter elements, for example current sources of the feedback digital/analog converter should respond simultaneously with the clock of the quantizer Q. The delay time between the conversion time of the quantizer and the presence of an analog feedback signal by the feedback digital/analog converter is called the excess loop delay (ELD).

The excess loop delay reduces the dynamic range of the sigma/delta modulator and impairs the stability of the control loop, particularly in the innermost feedback path which is implemented by the converter FBDN and the amplifier VN. Therefore, one can perform the dynamic element matching already in the quantizer Q. The reference voltages for the comparators provided in the quantizer are exchanged there from clock cycle to clock cycle so that the correspondingly modified quantizer device already outputs a randomized thermometer code. The disadvantageous factor is the high circuit complexity for the quantizer and the restriction to flash analog/digital converters as quantizers.

FIG. 2 shows a multi-bit sigma/delta converter MSD with feed forward loops for implementing the filter function of the modulator. In this arrangement, only one feedback loop is formed from a DEM device DEM, a feedback digital/analog converter FBD1 and an amplifier V1'. The analog input signal VIN is conducted through a serial chain of integrators I1, I2, IN, the output signals Z1, Z2, ZN of the integrators I1, I2, IN being picked up and supplied to feed forward amplifiers V1, V2, VN which have a respective gain factor c1, c2, cN.

Before the quantizer Q, the feed forward signals FF1, FF2 generated by the amplifiers V1, V2, VN are combined by an adder AN and supplied to the quantizer Q as quantizer input signal QIN.

In this feed forward architecture, there is a large excess loop delay which is not compensated even by the feedback digital/analog converter FBD1. Since inaccuracies, for example linearity deficits of the feedback digital/analog converter FBD1 have a direct effect on the input signal VIN, elaborate calibration of the digital/analog converter FBD1 is performed and/or a device for dynamic element matching may be additionally implemented.

It is therefore desirable to provide an improved multi-bit sigma/delta converter which has a large dynamic range and high stability.

SUMMARY OF THE INVENTION

According to at least a first embodiment of the invention, a multi-bit sigma/delta converter for converting an analog input signal into a digital output signal comprises the following elements: a filter device for filtering the analog input signal added to a feedback signal to form an intermediate signal, an integrator device for integrating the filtered intermediate signal added to an inner feedback signal to form a quantizer input signal, a quantizer device for quantizing the quantizer input signal to form the digital output signal, an inner feedback digital/analog converter for converting the digital output signal directly into the inner feedback signal, a DEM device for performing dynamic element matching on the digital output signal and outputting a matched digital signal, and a feedback analog/digital converter for converting the matched digital signal into the feedback signal.

BRIEF DESCRIPTION OF THE SEVERAL VIEWS OF THE DRAWINGS

In the figures:

FIG. 4: shows time sequences in the multi-bit sigma/delta converter according to the invention; and FIG. 5: shows a second embodiment of the multi-bit sigma/delta converter according to the invention.

Unless otherwise specified, identical or functionally identical elements have been provided with the same reference symbols in the figures.

DETAILED DESCRIPTION OF THE INVENTION

Figure 1:
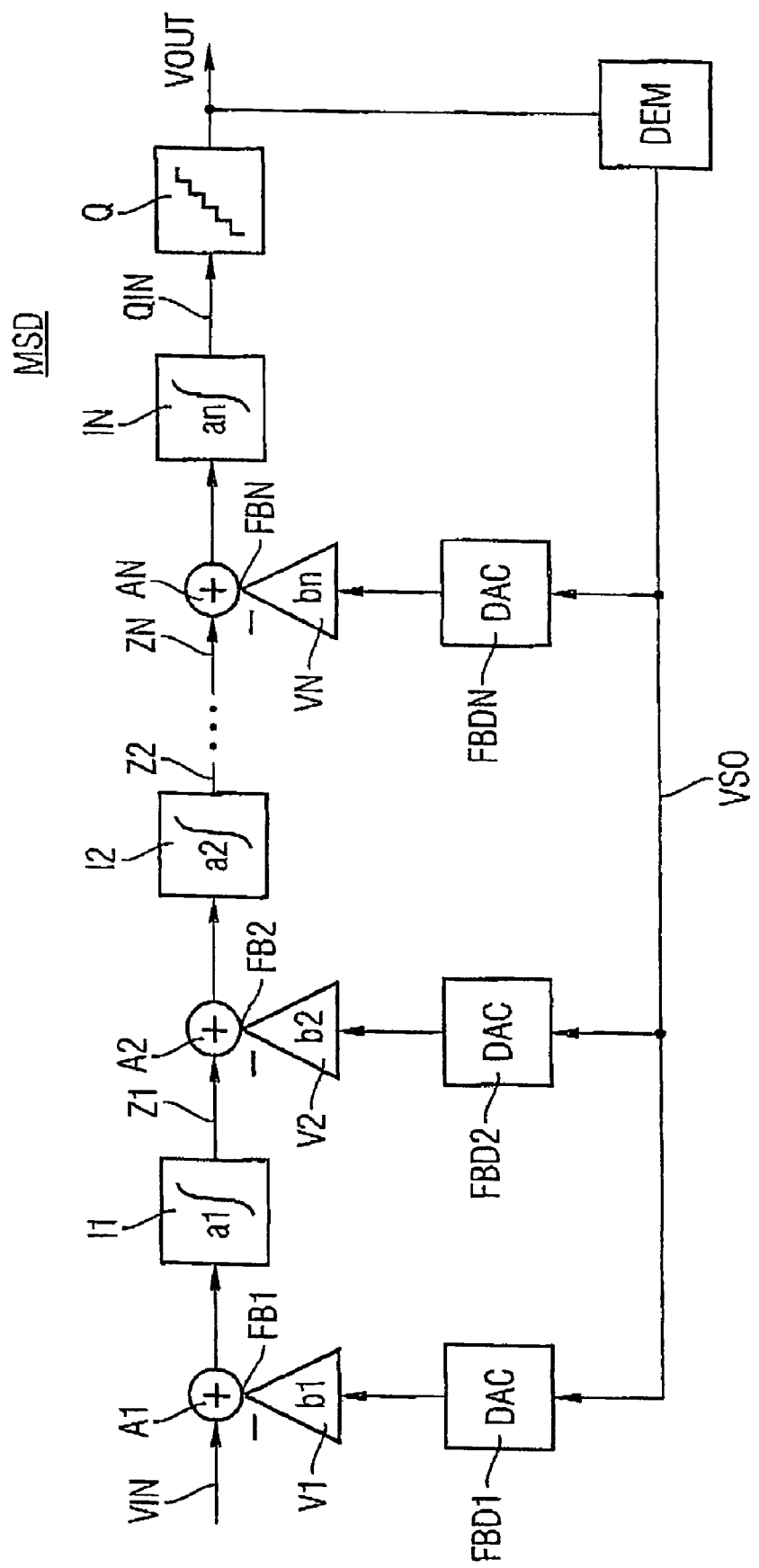
FIG. 1, FIG. 2: show conventional multi-bit sigma/delta converters.
Figure 2:
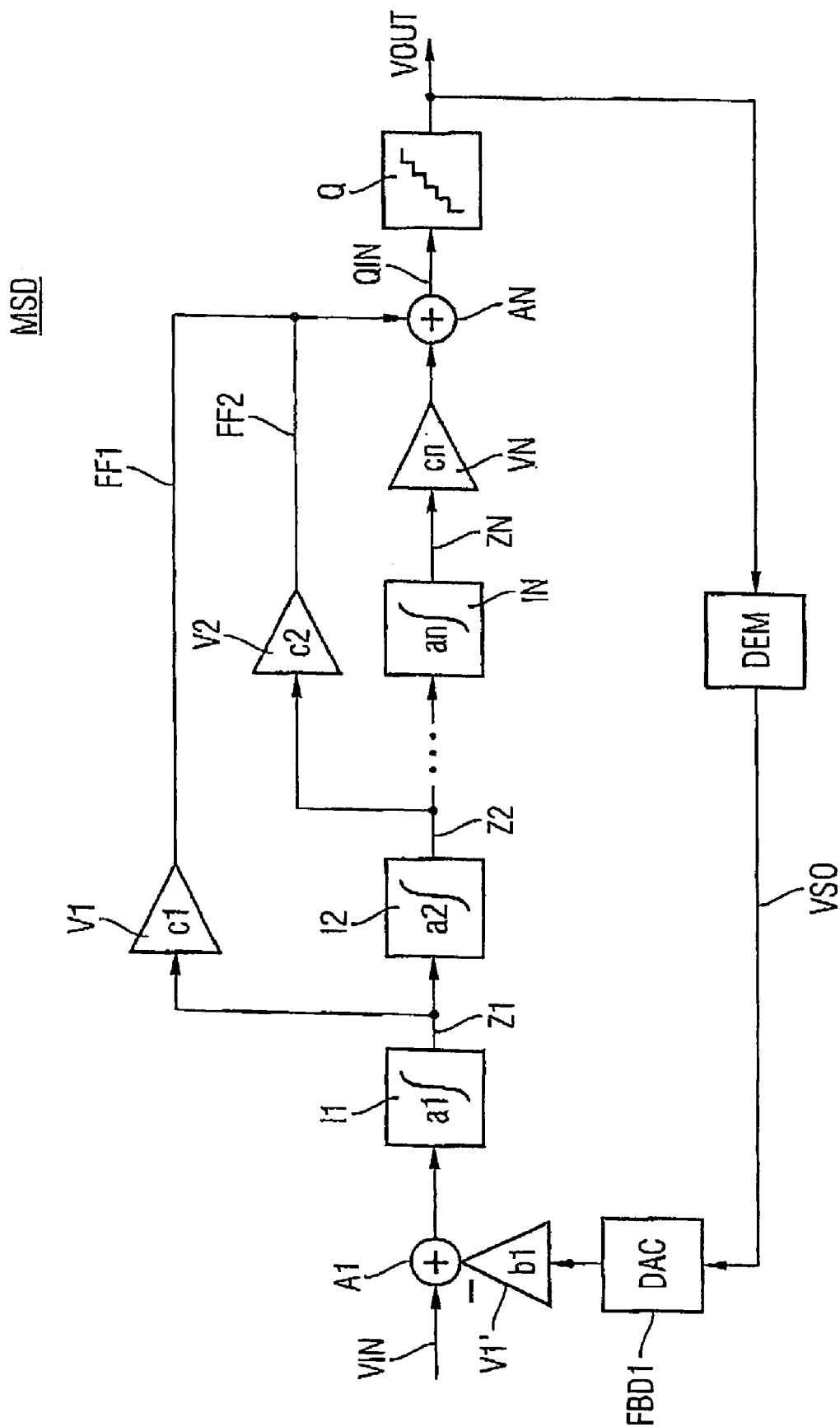

In an embodiment of the invention in terms of a multi-bit sigma/delta converter, no further circuit element which could extend the signal delay is provided in the innermost feedback loop determining the stability of the converter, which comprises the quantizer and the inner feedback digital/analog converter. This ensures good compensation for the excess loop delays.

According to the embodiment of the invention, dynamic element matching is performed in the outer feedback path which is formed by the feedback analog/digital converter which generates the feedback signal. This results in good linearity and a good dynamic range of the entire converter since the outer feedback digital/analog converter has a direct influence on the analog input signal.

The inner feedback signal, which is obtained directly from the digital output signal, is filtered with a higher order than the outer feedback signal so that any noise caused by the excess loop delay is suppressed better. The multi-bit sigma/delta converter thus has an improved stability characteristic compared with conventional architectures, due to the low excess loop delay and a large dynamic range due to the dynamic element matching in the outer feedback loop.

In one embodiment of the multi-bit sigma/delta converter according to the invention, at least one further feedback digital/analog converter is provided which converts the matched digital signal into a further feedback signal. The further feedback signal is added to the intermediate signal or subtracted.

At least one further filter device can be provided which filters the intermediate signal added to the further feedback signal to form a further intermediate signal.

A respective feedback signal is for example subtracted from the respective intermediate signal or the input signal by means of an adder.

The inner feedback digital/analog converter in another embodiment of the invention is constructed in such a manner that it has a shorter signal delay than the DEM device and the remaining feedback digital/analog converters. The feedback digital/analog converter and inner feedback digital/analog converter can differently constructed. For example, the embodiment of the inner feedback digital/analog converter as converter with a non-return-to-zero coding can be useful since a particularly short signal delay due to the digital/analog conversion thus occurs. The usual return-to-zero converters in most cases need a somewhat longer signal processing time.

At least one filter device is for example constructed as integrator.

In an alternative embodiment of the invention, the feedback digital/analog converters have in each case a weighting device by which the respective converted signal is weighted with a weighting factor. The filter function of the filter created by the feedback loops can be adapted, and the existing quantization noise can be modeled, by adapting the weighting factors.

In a further embodiment of the multi-bit sigma/delta converter according to the invention, at least one feed forward path comprising a weighting device is provided. An intermediate signal weighted with a weighting factor is added to the quantization signal. In this embodiment, an adjustment of the filter functions for noise shaping is for example also implemented by the feed forward paths. Nevertheless, the stability of the sigma/delta modulator remains unaffected due to the inner feedback path in which a direct conversion of the output signal into the feedback signal occurs.

The multi-bit sigma/delta converter according to the invention may be constructed as a continuous-time converter. The excess loop delay is particularly problematic especially in such an embodiment.

Further feedback loops may increase the filter order achieved by the sigma-delta modulator, the number of feedback loops provided over all by means of the feedback digital/analog converters specifying the order of the corresponding filter for modeling the quantization noise (noise shaping). According to the exemplary embodiment of the invention, use is advantageously made of the fact that the inner feedback signal is exposed to the highest filter order and, therefore, does not need dynamic element matching which provides for the high stability and low delay in the inner feedback loop.

Figure 3:
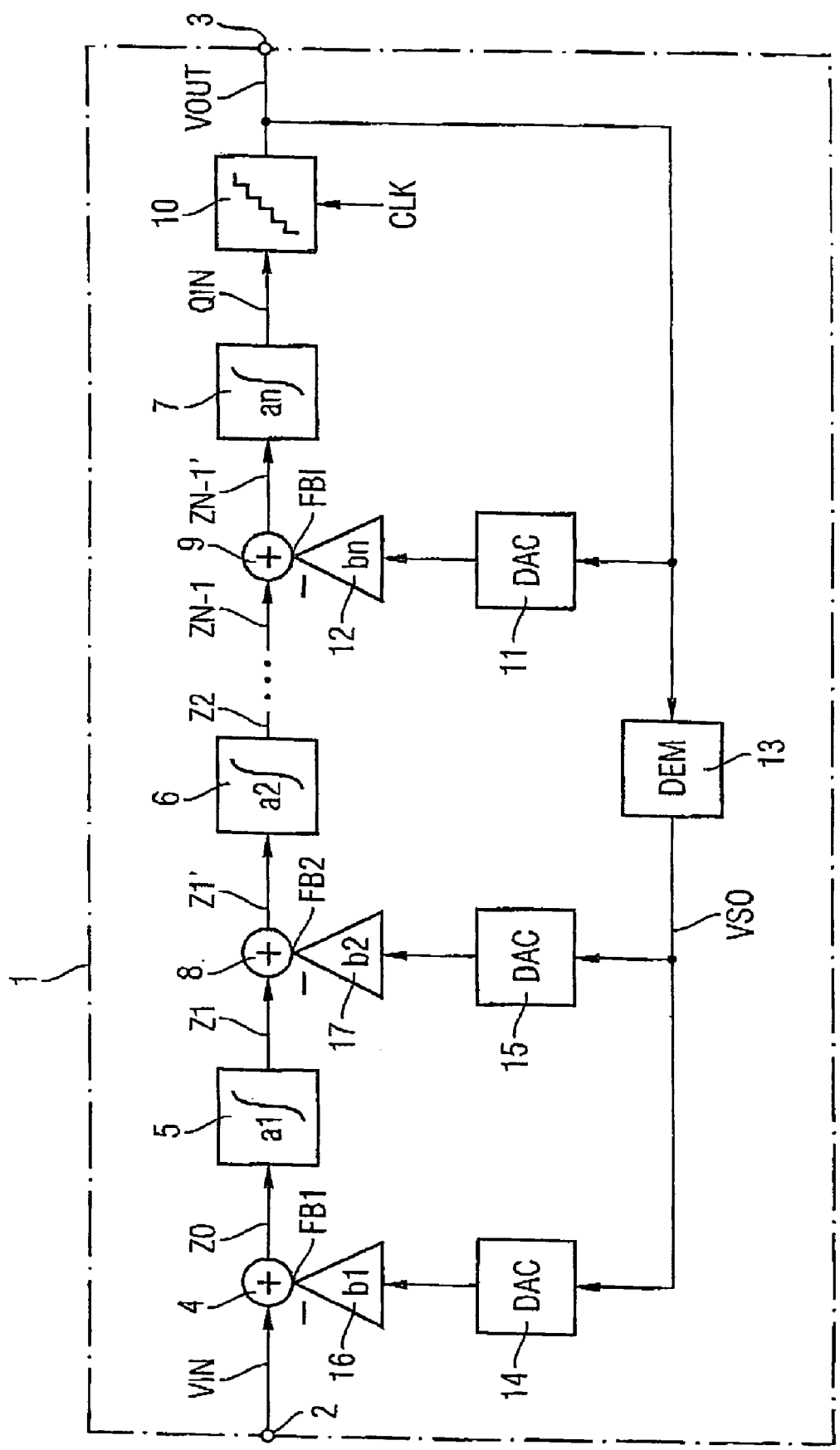
FIG. 3: shows a first embodiment of the multi-bit sigma/delta converter according to the invention.

FIG. 3 shows a first embodiment of the invention in terms of a multi-bit sigma/delta converter 1. The multi-bit sigma/delta converter 1 has an input 2 for the analog input signal VIN and an output 3 for the digital output signal VOUT. An outer feedback signal FB1 is added or subtracted from the input signal VN via an adder 4 by means of which an intermediate signal Z0 is generated.

A serial chain of integrators 5, 6, 7 is provided which are in each case preceded by an adder 8, 9. A feedback signal FB2, FB1 is subtracted from the respective output signal Z1, Z2 of the preceding integrator 5, 6 by the adders 8, 9. Although only three integrators 5, 6, 7 are shown by way of example in FIG. 3, N integrators can be provided in series in the general case.

The last integrator 7 is followed by a quantizer 10 which can be constructed, for example, as flash analog/digital converter. The quantizer 10 receives signal output by the Nth integrator 7 as quantization signal QIN and generates from this the digital output signal VOUT by quantization. The quantizer is clocked with a clock signal CLK.

An inner feedback signal FB1 which is supplied to the adder 9 preceding the last integrator 7 is generated by an inner feedback digital/analog converter 11 which is followed by a weighting device 12. The weighting is done, for example, in a current-type digital/analog converter, by selection of the respective current sources as converter elements in the digital/analog converter 11.

Furthermore, a DEM device 13 is provided which subjects the digital output signal VOUT to dynamic element matching and outputs a matched digital signal VSO. With a bit width of 3 of the multi-bit sigma/delta converter 1, the quantizer 10 is constructed, for example, as seven-step quantizer which outputs the digital output signal VOUT in a seven-digit thermometer code. The number of bits set in the seven-digit thermometer code correspond to the decimal value of the conversion result. Since the positions of the set bits does not play a role for determining this decimal value, the positions of the bits in the thermometer code can be exchanged. For example, the decimal value 3 of a seven-digit thermometer code 1110000 is equivalent to a reordered (thermometer) code 1010100. The DEM device 13 randomizes the positions of the digital signal VOUT, present in thermometer code, from clock cycle to clock cycle.

The digital signal VSO thus matched is supplied as input signal to the further feedback digital/analog converters 14, 15. The feedback digital/analog converters 14, 15 are in each case followed by a weighting device 16, 17 by which the analog output signal of the converters 14, 15 is weighted with weighting factors b1, b2.

In the multi-bit sigma/delta converter 1 according to an embodiment of the invention, an inner control loop is created by the integrator 7, the quantizer 10, the inner feedback digital/analog converter 11, the weighting device 12 and adders 9 which essentially determines the stability of the entire sigma/delta modulator. Due to the fact that, according to the invention, the inner feedback digital/analog converter converts the digital output signal VOUT directly into the inner feedback signal FB1, the corresponding signal delay in the inner control loop is particularly short.

The outer control loop which is formed by the integrator chain 5, 6, 7, the quantizer 10, the DEM device 13, the outer feedback digital/analog converter 14, the weighting device 16 and the adder 4 essentially determines the characteristics of the sigma/delta modulator with regard to the quantization noise, the dynamic range and the signal/noise ratio. The filtering according to the gain factors a1, a2 at the integrators and the weighting factors b1, b2, bn of the feedback digital/analog converters 11, 14, 15 produces shaping of the quantization noise of the multi-bit sigma/delta converter 1.

In this arrangement, the outer control loop with the feedback digital/analog converter 14 is the most critical factor since the corresponding feedback signal FB1 is directly linked to the analog input signal VIN. The second feedback signal FB2 which is subtracted from the intermediate signal Z1 or the output signal of the first integrator 5, respectively, via the adder 8 is already subjected to first-order filtering as a result of which the quantization noise is already shaped or limited, respectively. The innermost control loop or, respectively, the inner feedback signal FB1 is suppressed with filtering of the Nth order. For this reason, according to the invention, dynamic element matching is omitted in the inner feedback loop as a result of which the signal delay between the output of the quantizer 10 and the availability of the feedback signal FB1 is particularly short, i.e. there is a very low excess loop delay. The multi-bit sigma/delta converter 1 is therefore particularly stable and has low quantization noise.

FIG. 4 shows by way of example the signal forms occurring in the multi-bit sigma/delta converter 1 according to the first embodiment the invention. The clock signal CLK is shown, assuming that the sampling time of the quantizer 10 is defined at a rising clock edge, for example at a time $t_1$. At time $t_2$, the digital output signal VOUT is then present at the output 3 of the multi-bit sigma/delta converter 1.

In FIG. 4, the switch of a bit in thermometer code from a logical L to a logical H, i.e. from 0 to 1 (curve A) and the switch from 1 to 0 of a bit in curve B is shown by way of example. Curves A, B illustratively in each case correspond to a position in the associated thermometer code of the digital output signal VOUT.

Due to the processing time in the DEM device 13, the matched signal VSO is available at a later time $t_3$. In the example shown here, the two positions in the thermometer code of the digital output signal VOUT which are described by curves A, B are exchanged with one another. Curve A thus corresponds to curve D after the exchange and curve B corresponds to curve C after the exchange by the DEM device 13. Digital/analog conversion by the outer feedback digital/analog converters 14, 15 is then possible only at time $t_3$. Thus, an excess loop delay ELD of $t_3-t_1$ occurs for the feedback loops in which dynamic element matching is performed.

Since the inner feedback loop occurs due to direct digital/analog conversion of the output signal VOUT into the inner feedback signal FBI, the corresponding feedback signal FBI is already available at a time $t_2$, that is to say virtually at the same time as the bits in the thermometer code of the digital output signal VOUT are present at the adder 9. The corresponding inner excess loop delay ELDI is therefore considerably shorter which increases the stability of the control loop of the multi-bit sigma/delta converter 1.

In this arrangement, the inner feedback digital/analog converter 11 is constructed in such a manner that the delay time is particularly short. In a preferred embodiment, e.g. a feedback digital/analog converter 11 with non-return-to-zero code (NRZ) is used which results in a faster presence of the analog output signal compared with digital/analog converters operating with return-to-zero code. In the case of a return-to-zero code digital/analog converter, the data are combined with a clock signal. This requires an additional logic gate in the embodiment of a corresponding return-to-zero digital/analog converter which causes a signal delay. In the case of non-return-to-zero code digital/analog converters, in contrast, the input data are not combined with the clock signal. Therefore, the data present at an input of the digital/analog converter are immediately available for switching a converter element, e.g. a switchable current source.

FIG. 5 shows a second embodiment of the invention in terms of a multi-bit sigma/delta converter 100. Elements which are identical compared with FIG. 3 have been provided with the same reference symbols. In the text which follows, only the differences with respect to the multi-bit sigma/delta converter 1 of FIG. 3 are described.

According to the second embodiment, the quantizer 10 is preceded by integrator 7 to which the output of adder 18 is supplied. Furthermore, the output signal Z1 of the first integrator 5 is picked up and loaded with a weighting factor c1 by a weighting device 19. The corresponding signal FF1 is also supplied to the adder 18 as feed forward signal. The order or shape of the filtering produced by the sigma/delta modulator can be influenced further by the additional feed forward path through the weighting device 19. However, the essential factor is also in the embodiment 100 that the inner feedback signal FBI is obtained directly from the digital output signal VOUT without further delay. The remaining feedback signals FB1, FBN' have a high linearity and less quantization noise due to the dynamic element matching performed by means of the DEM device 13.

Although the present invention has been explained in greater detail with reference to preferred embodiments, it is not restricted to these but can be modified in many different ways. The feedback digital/analog converters used can be constructed differently in the inner and outer loops. For example, different methods can be used in the digital/analog conversions, preferably an NRZ code in the interior of the feedback digital converters and an RZ code in the outer feedback digital/analog converters. In the multi-bit sigma/delta converters according to the invention, both current-type and voltage-type digital/analog converters can be used as long as the delay time of the inner digital/analog converter is the shortest. The present invention is particularly suitable for use as digital/analog converter when a large bandwidth is desired.

What is claimed is:

1. A multi-bit sigma/delta converter for converting an analog input signal into a digital output signal, comprising:
   a filter operably coupled to receive the analog input signal added to a feedback signal and configured to generate an intermediate signal;
   an integrator device operably coupled to receive the intermediate signal added to an inner feedback signal and configured to generate a quantizer input signal;
   a quantizer device operably coupled to receive the quantizer input signal and to generate the digital output signal;
   an inner feedback digital/analog converter configured to convert the digital output signal directly into the inner feedback signal;
   a dynamic element matching (DEM) device operably coupled to receive the digital output signal and configured to provide a matched digital signal; and
   a feedback digital/analog converter for converting the matched digital signal into the feedback signal.

2. The multi-bit sigma/delta converter according to claim 1, further comprising at least one further feedback digital/analog converter configured to convert the matched digital signal into a further feedback signal, and wherein the further feedback signal is added to the intermediate signal.

3. The multi-bit sigma/delta converter according to claim 2, further comprising at least one further filter device operably coupled to receive the intermediate signal added to the further feedback signal.

4. The multi-bit sigma/delta converter according to claim 2, further comprising at least one further filter device which filters the intermediate signal added to the further feedback signal to form a further intermediate signal.

5. The multi-bit sigma/delta converter according to claim 1, further comprising an adder that is configured to add the feedback signal negatively to the input signal.

6. The multi-bit sigma/delta converter according to claim 1, wherein the inner feedback digital/analog converter has a shorter signal delay than the DEM device and/or the feedback digital/analog converter.

7. The multi-bit sigma/delta converter according to claim 1, wherein the feedback digital/analog converter and the inner feedback digital/analog converter are differently constructed.

8. The multi-bit sigma/delta converter according to claim 1, wherein the filter comprises an integrator.

9. The multi-bit sigma/delta converter according to claim 1, wherein the feedback digital/analog converter includes a weighting device by which the converted signal is weighted with a weighting factor.

10. The multi-bit sigma/delta converter according to claim 1, further comprising at least one feed forward path comprising a weighting device.

11. The multi-bit sigma/delta converter according claim 1, wherein the multi-bit sigma/delta converter is constructed as a continuous-time converter.

12. A multi-bit sigma/delta converter for converting an analog input signal into a digital output signal, comprising:
   means for filtering the analog input signal added to a feedback signal to form an intermediate signal;
   means for integrating the intermediate signal added to an inner feedback signal to form a quantizer input signal;
   means for quantizing the quantizer input signal to form the digital output signal;
   means for converting the digital output signal directly into the inner feedback signal;
   means for performing dynamic element matching on the digital output signal and providing a matched digital signal; and
   means for converting the matched digital signal into the feedback signal.

13. The multi-bit sigma/delta converter according to claim 12, further comprising means for converting the matched digital signal into a further feedback signal; and wherein the further feedback signal is added to the intermediate signal.

14. A multi-bit sigma/delta converter for converting an analog input signal into a digital output signal, comprising:
   a filter operably coupled to receive the analog input signal added to a feedback signal and configured to generate an intermediate signal;
   a quantizer device configured to generate the digital output signal at an output, the quantizer device further configured to receive a quantizer input signal;
   an integrator device operably coupled between the filter and quantizer, the integrator device configured to provide the quantizer input signal, wherein the quantizer input signal is produced by adding the intermediate signal and an inner feedback signal;
   an inner feedback digital/analog converter coupled between the output and a first location, the first location disposed between the filter and the integrator device, the inner feedback digital/analog converter configured to convert the digital output signal into the inner feedback signal;
   a dynamic element matching (DEM) device operably coupled between the output and a second location, the second location disposed between an analog signal input and the filter; and
   a feedback digital/analog converter operably coupled between the DEM device and the second location.

15. The multi-bit sigma/delta converter according to claim 14, further comprising a first summation device at the first location.

16. The multi-bit sigma/delta converter according to claim 15, further comprising a second summation device at the second location.

17. The multi-bit sigma/delta converter according to claim 14, further comprising at least one further feedback digital/analog converter coupled between the DEM device and a third location, the third location between the filter and the integrator device.

18. The multi-bit sigma/delta converter according to claim 17, further comprising at least one further filter device operably coupled between the third location and the integrator device.

19. The multi-bit sigma/delta converter according to claim 14, wherein the inner feedback digital/analog converter has a shorter signal delay than the DEM device and/or the feedback digital/analog converter.

20. The multi-bit sigma/delta converter according to claim 14, wherein the filter comprises an integrator.

* * * * *